United States Patent
Kurihara

(10) Patent No.: US 8,350,606 B2
(45) Date of Patent: Jan. 8, 2013

(54) DELAY CIRCUIT

(75) Inventor: Shinji Kurihara, Ota (JP)

(73) Assignees: Sanyo Electric Co., Ltd., Osaka (JP); Sanyo Semiconductor Co., Ltd., Ora-Gun, Gunma (JP)

(*) Notice: Subject to any disclaimer, the term of this patent is extended or adjusted under 35 U.S.C. 154(b) by 270 days.

(21) Appl. No.: 12/776,906

(22) Filed: May 10, 2010

(65) Prior Publication Data

US 2010/0289540 A1 Nov. 18, 2010

(30) Foreign Application Priority Data

May 14, 2009 (JP) .................. 2009-117955

(51) Int. Cl.
*H03L 7/06* (2006.01)
(52) U.S. Cl. .................................................. 327/157
(58) Field of Classification Search .................... 327/157
See application file for complete search history.

(56) References Cited

U.S. PATENT DOCUMENTS 6,043,695 A * 3/2000 O'Sullivan ............... 327/157

FOREIGN PATENT DOCUMENTS

JP A 2008-136031 6/2008

* cited by examiner

*Primary Examiner* — Daniel Rojas
(74) *Attorney, Agent, or Firm* — Oliff & Berridge, PLC

(57) ABSTRACT

In a delay circuit for inputting square waves, fluctuations in the amount of delay brought about by noise pulses present in input signals are reduced. A switch (SW3) is controlled by an output signal (Vdo) from a Schmitt comparator, and selects either an electric current source for supplying a charging current to a capacitor (Cst) or an electric current source for supplying a discharging current. A current supply from the selected electric current source is turned on/off by controlling switches (SW1, SW2) using an input signal (Vdi). The Schmitt comparator switches the level of Vdo in accordance with a voltage of Cst. The charging current is supplied to Cst when Vdi is H level at rising edge of Vdi, and the discharging current is supplied to Cst when Vdi is L level at trailing edge of Vdi.

3 Claims, 9 Drawing Sheets

PRIOR ART

DELAY CIRCUIT

CROSS-REFERENCE TO RELATED APPLICATION

The present application claims priority from Japanese application JP 2009-117955 filed on May 14, 2009, the content of which is hereby incorporated by reference into this application.

BACKGROUND OF THE INVENTION

1. Field of the Invention

The present invention relates to a delay circuit for creating a delay in a square wave.

2. Description of the Related Art

A delay circuit for creating a delay in a square wave is used in a delay locked loop (DLL), for example. FIG. 7 is a block diagram showing the structure of a DLL. The DLL has a phase detector (PD) 2, a charge pump 4, a capacitor C, and a voltage controlled delay line (VCDL) 6.

A square-wave input signal Vin is input to the phase detector 2 and the voltage controlled delay line 6. The voltage controlled delay line 6 outputs to the phase detector 2 a delay signal Vd1 for creating the delay of Vin in a quantity that corresponds to a delay control signal Vcnt. The phase detector 2 produces a difference signal composed of a pulse whose width corresponds to the phase difference between Vin and Vd1, and outputs the pulse to the charge pump 4.

The charge pump 4 converts the difference signal from the phase detector 2 to an electric current, an electric current directed so that the capacitor C is charged is produced in a period in which the pulse in the difference signal is at an H (high) level, and an electric current directed so that the capacitor C is discharged is produced in a period in which the pulse is at an L (low) level. The capacitor C integrates the output current of the charge pump 4 and produces a voltage (error signal) that corresponds to the integration result. The error signal is supplied to the voltage controlled delay line 6 as the delay control signal Vcnt.

The voltage controlled delay line 6 includes a plurality of delay cells connected in series. FIG. 8 is a circuit diagram of a delay cell. The delay cell shown in FIG. 8 has a differential amplifier circuit in which transistors M01, M02 constitute a differential pair. The differential output of the preceding cell is input as an input signal Vcin to the differential pair. Transistors M03, M04 functioning as load resistors are connected to the transistors M01, M02, respectively. The transistors M03, M04 are used in a triode region, and the on-resistance Ron thereof is controlled by the delay control signal Vcnt impressed on a gate. The output signal Vcout of the differential amplifier circuit creates a delay relative to the input signal Vcin in accordance with the time constant $\tau$ ($=Ron \cdot Ct$) of an RC circuit composed of Ron and Ct, where Ct is the capacitance between the ground and the output terminal of the delay cell. In a case in which, for example, the transistors M03, M04 are p-channel MOS transistors, the delay time of the voltage controlled delay line 6 increases as a result of the fact that the on-resistance Ron and the value of $\tau$ both increase when the voltage Vcnt increases in the positive region.

Patent Document 1: JP-A 2008-136031

SUMMARY OF THE INVENTION

The conventional voltage controlled delay line 6 described above can generate noise pulses in the delay signal Vd1 as well in cases in which the input signal Vin includes noise pulses. A case may be described, for example, in which a frequency modulated (FM) signal is converted into a pulse signal synchronized with the vibrations of the modulated signal. A pulse signal 12 for switching between the H level and the L level at every half cycle of the FM signal 10 as shown by waveform (b) in FIG. 9 is generated when the noise-free FM signal 10 shown by waveform (a) in FIG. 9 is binarized using a threshold setting at the center of the amplitude. In contrast, narrow pulses (noise pulses 18) brought about by a noise component 16 can be generated in the vicinity of the timing at which the inherent FM signal 10 intersects with the threshold, as shown by waveform (b) in FIG. 10, during binarization of an FM signal 14 such as the one shown by waveform (a) in FIG. 10 and obtained by superposing the noise component 16 on the waveform of the inherent FM signal 10. When a pulse signal 20 accompanied by the noise pulses 18 is compared with the pulse signal 12 shown by waveform (b) in FIG. 9, a state is observed in which the pulse signal 20 fluctuates in the direction of the temporal axis. Inputting the pulse signal 20 into the conventional voltage controlled delay line 6 causes noise pulses to appear in the output delayed pulse signal, and a fluctuating state to develop. The presence of the noise pulses becomes the cause of the jitter in the subsequent signal processing of the delayed pulse signal, and brings about problems such as a reduction in the accuracy and reliability of the signal processing.

FIG. 11 is a schematic diagram of a signal waveform describing the problem in a DLL using a conventional voltage controlled delay line 6. Waveform (a) in FIG. 11 shows the input signal Vin. Vin is a pulse signal 20 accompanied by the noise pulses 18. Waveform (b) in FIG. 11 shows the delay signal Vd1 output by the voltage controlled delay line 6. Noise pulses 22 switched at a narrow cycle in accordance with the noise pulses 18 appear in the portions (rising edge, trailing edge) of Vd1 where the signal level is switched as described above. The phase detector 2 outputs a signal expressed by the exclusive-or of Vin and Vd1 as a signal Vpd that corresponds to the phase difference between Vin and Vd1. Waveform (c) in FIG. 11 shows an output current Icp of the charge pump 4 relative to the signal Vpd from the phase detector 2. Noise pulses 24, 26 corresponding to the waveform of the noise pulses 18, 22 appear in the electric current Icp. The capacitor C integrates the electric current Icp and generates the delay control signal Vcnt. Waveform (d) in FIG. 11 shows the variation in the delay control signal Vcnt. Vcnt rises (waveform 28) during the period in which the output current Icp of the charge pump 4 flows in the charging direction, and declines (waveform 30) during the period in which Icp flows in the discharging direction. Vcnt has substantially flat waveforms 32, 34 during the period of the noise pulses 24, 26 as a result of the fact that the charge and discharge substantially cancel out each other. A problem arises in the period in which Vcnt is flat in that a dead zone in which the loop control of the DLL does not function is generated without any change in the delay of the voltage controlled delay line 6.

The demodulated signal of the FM signal can be obtained on the basis of Vcnt in cases in which Vin is an FM signal. In this case, the presence of a flat period attributable to the noise pulses described above presents a problem in that the gain of the demodulated signal is caused to decrease and the S/N ratio is reduced.

The present invention, which was created in order to solve the above problems, provides a delay circuit in which the delay fluctuations attributable to noise pulses are reduced, making it possible to improve the accuracy and reliability of the DLL and to increase the S/N ratio of an FM demodulator in which the DLL is used.

In the delay circuit according to the present invention, the level of an output signal is delayed and switched relative to the switching between two levels in an input signal; in a period in which the output signal is at a first output level correlated with a first input level of the input signal, the predetermined quantity to be evaluated is increased according to an integrated value of a period in which the input signal is at a second input level, and the output signal is switched from the first output level to a second output level when the quantity to be evaluated exceeds a predetermined upper threshold; whereas in a period in which the output signal is at the second output level correlated with the second input level, the quantity to be evaluated is reduced according to the integrated value of a period in which the input signal is at the first input level, and the output signal is switched from the second output level to the first output level when the quantity to be evaluated falls below a lower threshold set lower than the upper threshold.

DETAILED DESCRIPTION OF THE INVENTION

Figure 1:
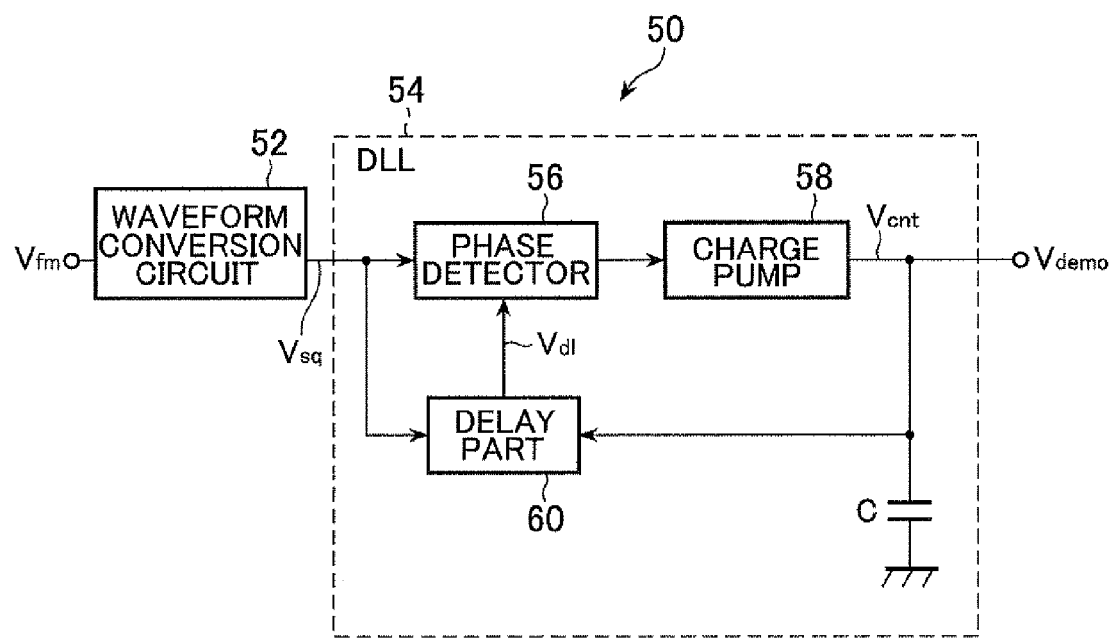
FIG. 1 is a block diagram showing the general structure of an FM demodulator as an embodiment of the present invention.

Described below based on the diagrams are a delay circuit, a DLL, and an FM demodulator as embodiments of the present invention. FIG. 1 is a block diagram showing the general structure of an FM modulator 50 as an embodiment of the present invention. The FM modulator 50 has a waveform conversion circuit 52 and a DLL 54. The DLL 54 is an embodiment of a delay locked loop according to the present invention, and has a phase detector 56, a charge pump 58, a capacitor C, and a delay part 60.

The waveform conversion circuit 52 inputs an FM signal Vfm of an analog signal and generates a pulse signal Vsq obtained by binarizing fluctuations of the FM signal. For example, the waveform conversion circuit 52 is composed of a comparator in which the center level of the amplitude of the FM signal Vfm constitutes the threshold, outputs an L level during the period in which Vfm falls below the threshold, and, conversely, outputs an H level during the period in which Vfm is at or above the threshold. The pulse signal Vsq is the input signal for the DLL 54.

The pulse signal Vsq, which is the signal input to the DLL 54, is input to the phase detector 56 and the delay part 60. The delay part 60 outputs to the phase detector 56 a delay signal Vd1 for delaying Vsq in a quantity that corresponds to a delay control signal Vcnt. The phase detector 56 generates a difference signal composed of a pulse whose width corresponds to the phase difference between Vsq and Vd1, and outputs the pulse to the charge pump 58.

The charge pump 58 and the capacitor C constitute a loop filter for generating a control signal (delay control signal Vcnt) for the delay part 60 on the basis of the output of the phase detector 56. The charge pump 58 converts a phase detection result signal from the phase detector 56 into an electric current; generates, for example, an electric current in the direction of charging the capacitor C in a period in which the pulse in the difference signal is at the H level, and generates an electric current in the direction of discharging the capacitor C in a period in which the pulse is at the L level. The capacitor C integrates the output current of the charge pump 58 and produces a voltage (error signal) that corresponds to the integral result. The error signal is supplied to the delay part 60 as the delay control signal Vent.

The DLL 54 operates so as to provide synchronization with the frequency-modulated pulse signal Vsq by using feedback control. The result is that the delay control signal Vent for the delay part 60 in DLL 54 has a voltage that corresponds to the frequency shift amount of Vsq, and the FM modulator 50 outputs Vent as a demodulated signal Vdemo of the FM signal Vfm.

Figure 2:
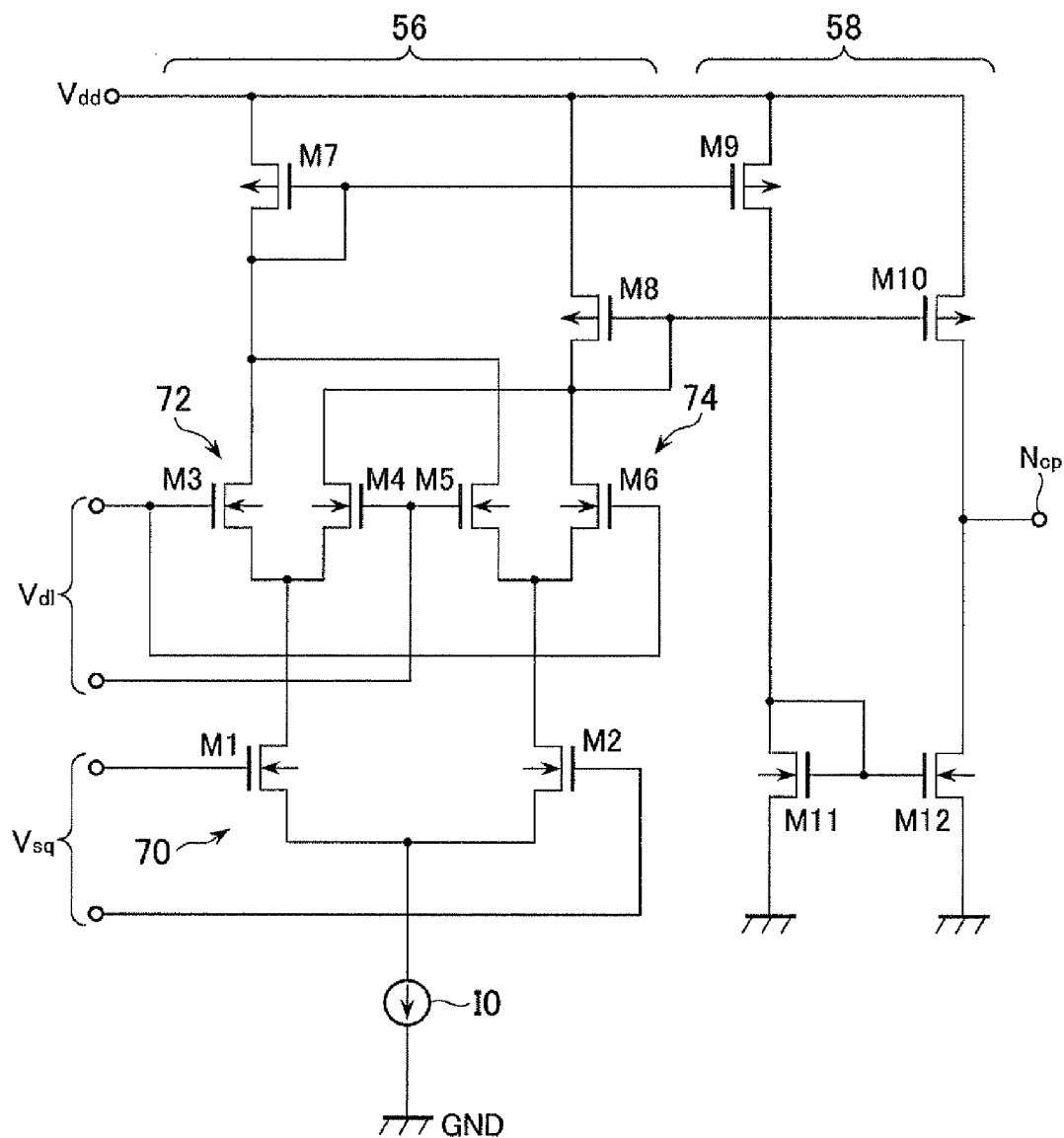
FIG. 2 is a general circuit diagram of a phase detector and a charge pump.

FIG. 2 is a general circuit diagram of the phase detector 56 and the charge pump 58. The phase detector 56 inputs the pulse signal Vsq and the delay signal Vd1, compares the phases thereof, and outputs a difference signal that corresponds to the phase difference to the charge pump 58. The charge pump 58 generates and outputs an electric current that corresponds to the difference signal.

The phase detector 56 is composed of a Gilbert cell mixer circuit. The circuit is a double-balanced multiplier circuit and has a differential pair 70 composed of n-channel MOS transistors M1, M2 whose sources are jointly connected to a current generator I0, a differential pair 72 composed of n-channel MOS transistors M3, M4 whose sources are jointly connected to the drain of the transistor M1, and a differential pair 74 composed of n-channel MOS transistors M5, M6 whose sources are jointly connected to the drain of the transistor M2. For example, the pulse signal Vsq is input in the form of a differential signal to the gates of the transistors M1, M2 in the differential pair 70, and the delay signal Vd1 is input in the form of a differential signal to the differential pairs 72, 74. One side of the differential signal Vd1 is input to the gates of the transistors M3, M6 in the differential pairs 72, 74 and another side of the differential signal Vd1 is input to the gates of the transistors M4, M5 in the differential pairs 72, 74.

The phase detector 56 generates a signal that corresponds to the product of Vsq and Vd1, and outputs the signal to the charge pump 58 as a difference signal. Specifically, the electric current I0 flows to a p-channel MOS transistor M7 jointly connected to the respective drains of the transistors M3, M5 in cases in which the combination (Vsq, Vd1) of the H/L levels of Vsq impressed on the gate of the transistor M1 and the H/L levels of Vd1 impressed on the gates of the transistors M3, M6 is (H, H) and (L, L), whereas the electric current I0 flows to a p-channel MOS transistor M8 jointly connected to the respective drains of the transistors M4, M6 in cases in which the combination is (H, L) and (L, H). The electric currents (or the gate potentials thereof) flowing through the transistors M7, M8 constitute a difference signal.

The charge pump 58 has a transistor M9 that forms a pair with the transistor M7 and constitutes a current mirror circuit, a transistor M10 that forms a pair with the transistor M8 and constitutes a current mirror circuit, and a current mirror circuit constructed from transistors M11, M12. The electric current flowing through the transistor M8 is replicated in the transistor M10, and flows toward an output terminal Ncp of the charge pump 58. The channels of the transistor M9 and the transistor M11 are connected in series to each other, the electric current of the transistor M7 is reversed in the two current mirror circuits, and the electric current of the transistor M7 is replicated in the transistor M12. The transistor M12 generates an electric current directed toward the transistor M12 from the output terminal Ncp.

Figure 3:
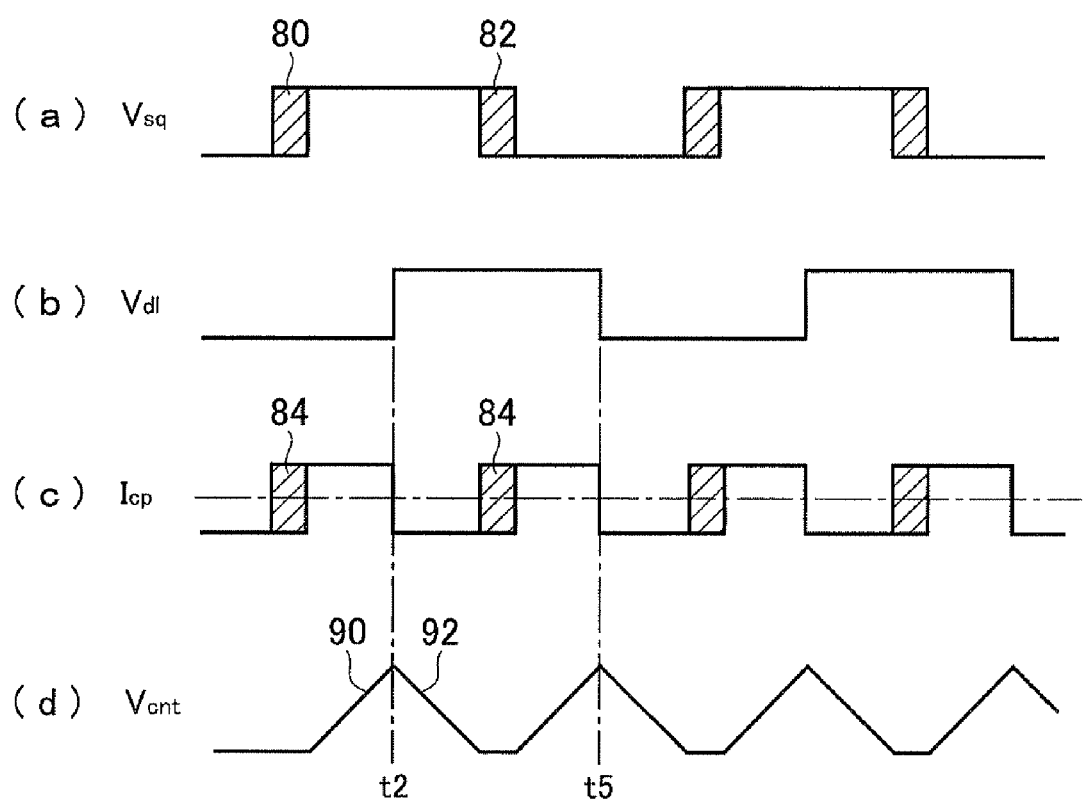
FIG. 3 is a schematic diagram of signal waveforms describing the operation of a DLL in an embodiment of the present invention.

FIG. 3 is a schematic diagram of signal waveforms describing the operation of the DLL 54. Waveform (a) in FIG. 3 expresses the pulse signal Vsq. Vsq expresses a pulse signal accompanied by noise pulses 80, 82. Waveform (b) in FIG. 3 expresses the delay signal Vd1. Noise pulses that correspond to the noise pulses 80, 82 are removed from the portions (rising edge, trailing edge) of Vd1 where the signal level is switched, as described below.

Waveform (c) in FIG. 3 expresses an output current Icp of the charge pump 58. Icp is a positive electric current, and flows in the direction of charging the capacitor C in cases in which (Vsq, Vd1) are (H, H) and (L, L), whereas Icp is a negative electric current, and flows in the direction of discharging the capacitor C in the case of (H, L) and (L, H). The absolute values of Icp in both states are set so as to be substantially equal to each other.

The capacitor C integrates the electric current Icp and generates the delay control signal Vcnt. Waveform (d) in FIG. 3 expresses the variation in the delay control signal Vcnt. Vcnt rises (waveform 90) in the period in which the output current Icp of the charge pump 58 is positive, and declines (waveform 92) in the period in which Icp is negative.

The delay part 60 is constructed using a delay circuit 100 according to the present invention. The delay circuit 100 is a delay circuit in which the level of the output signal Vdo thereof is delayed and switched relative to the switching between the two levels H, L in the input signal Vdi thereof. The delay circuit 100 can be configured so that a signal obtained by delaying the input signal Vdi is inverted and output. In this case, however, a configuration is adopted in which the input signal Vdi is merely delayed and output without being inverted.

In the pure delay structure, the L level is correlated as a first output level of the output signal Vdo with the L level (first input level) of the input signal Vdi, and the H level is correlated as a second output level of the output signal Vdo with the H level (second input level) of the input signal Vdi. In the delay circuit 100, in a period in which the output signal Vdo is at the L level, a predetermined quantity Es to be evaluated is increased according to an integrated value of a period in which the input signal Vdi is at the H level, and the output signal Vdo is switched from the L level to the H level when the quantity Es to be evaluated exceeds a predetermined upper threshold Vth1. On the other hand, in a period in which the output signal Vdo is at the H level, the quantity Es to be evaluated is reduced according to the integrated value of a period in which the input signal Vdi is at the L level, and the output signal Vdo is switched from the H level to the L level when the quantity Es to be evaluated declines below a lower threshold Vth2 set lower than the upper threshold Vth1.

Figure 4:
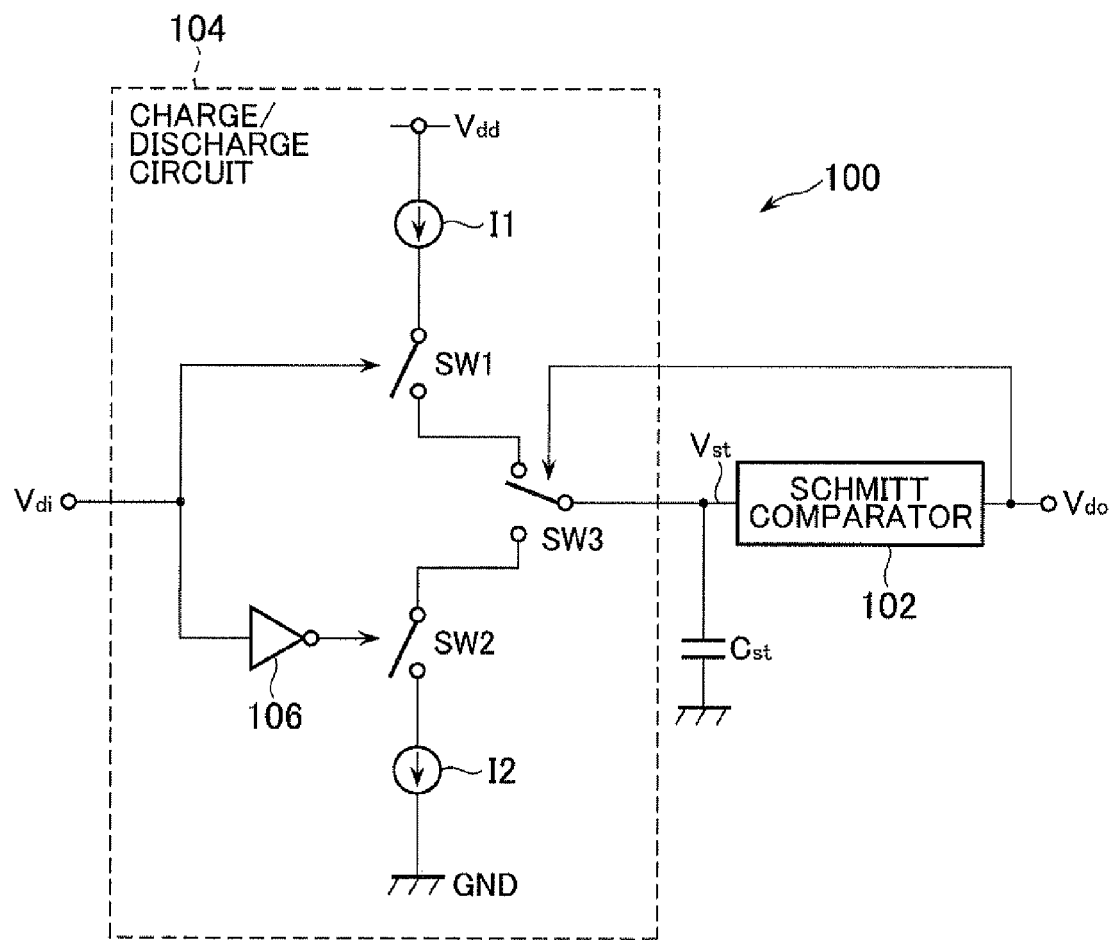
FIG. 4 is a general circuit diagram showing a delay circuit according to the present invention.

FIG. 4 is a general circuit diagram showing the delay circuit 100 as an embodiment of the delay circuit of the present invention. In the delay circuit 100, the pulse signal Vsq is input as the input signal Vdi, and the delay signal Vd1 is output as the output signal Vdo. The delay circuit 100 has a Schmitt comparator 102 (Schmitt trigger comparator), a capacitor Cst, and a charge/discharge circuit 104.

The capacitor Cst is charged and discharged by the charge/discharge circuit 104 according to the input signal Vdi, and generates a voltage Vst that corresponds to the amount of charge. The voltage Vst is the quantity Es to be evaluated in the delay circuit 100. The voltage Vst constitutes the input voltage of the Schmitt comparator 102. As can be understood from the operation described below, the delay circuit 100 creates a delay that corresponds with the time needed to charge and discharge the capacitor Cst.

In the Schmitt comparator 102, the upper threshold Vth1 and the lower threshold Vth2 are set for the input voltage Vst, the output signal Vdo is switched from the L level to the H level when Vst exceeds the upper threshold Vth1, and the output signal Vdo is switched from the H level to the L level when Vst declines below the lower threshold Vth2.

The charge/discharge circuit 104 alternatively outputs a charging current to charge the capacitor Cst and a discharging current to discharge the capacitor Cst. Specifically, in the charge/discharge circuit 104, the charging current is selectively output in the period in which the output signal Vdo is at the L level and the input signal Vdi is at the H input level, and the discharging current is selectively output in the period in which the output signal Vdo is at the H level and the input signal Vdi is at the L input level.

The charge/discharge circuit 104 shown in FIG. 4 has electric current sources I1, I2; switches SW1 to SW3; and an inverter 106. The electric current source I1 is provided between a positive voltage Vdd and the capacitor Cst, and generates the discharging current. On the other hand, the electric current source I2 is provided between a ground potential GND and the capacitor Cst, and generates the discharging current.

The switch SW3 is a switch (charge/discharge selection switch) for selecting whether to connect either the electric current source I1 or the electric current source I2 to the capacitor Cst. The switch SW3 is controlled by the output signal Vdo, and the switch selects the electric current source I1 when the output signal Vdo is at the L level, and selects the electric current source I2 when the output signal Vdo is at the H level.

The switch SW1 is connected in series between the electric current source I1 and the switch SW3, and is a switch (discharge control switch) for selectively establishing an on-state in the period in which the input signal Vdi is at the H level. For example, the switch SW1 can be constituted of an re-channel MOS transistor in which the input signal Vdi is impressed on the gate.

The switch SW2 is connected in series between the electric current source I2 and the switch SW3, and is a switch (discharge control switch) for selectively establishing an on-state in the period in which the input signal Vdi is at the L level. The switch SW2, similar to the switch SW1, is constituted of an n-channel MOS transistor; an input signal Vdi inverted by the inverter 106 is impressed on the gate of the switch; and the on/off-state is controlled by this switch in complementary fashion relative to the switch SW1.

Figure 5:
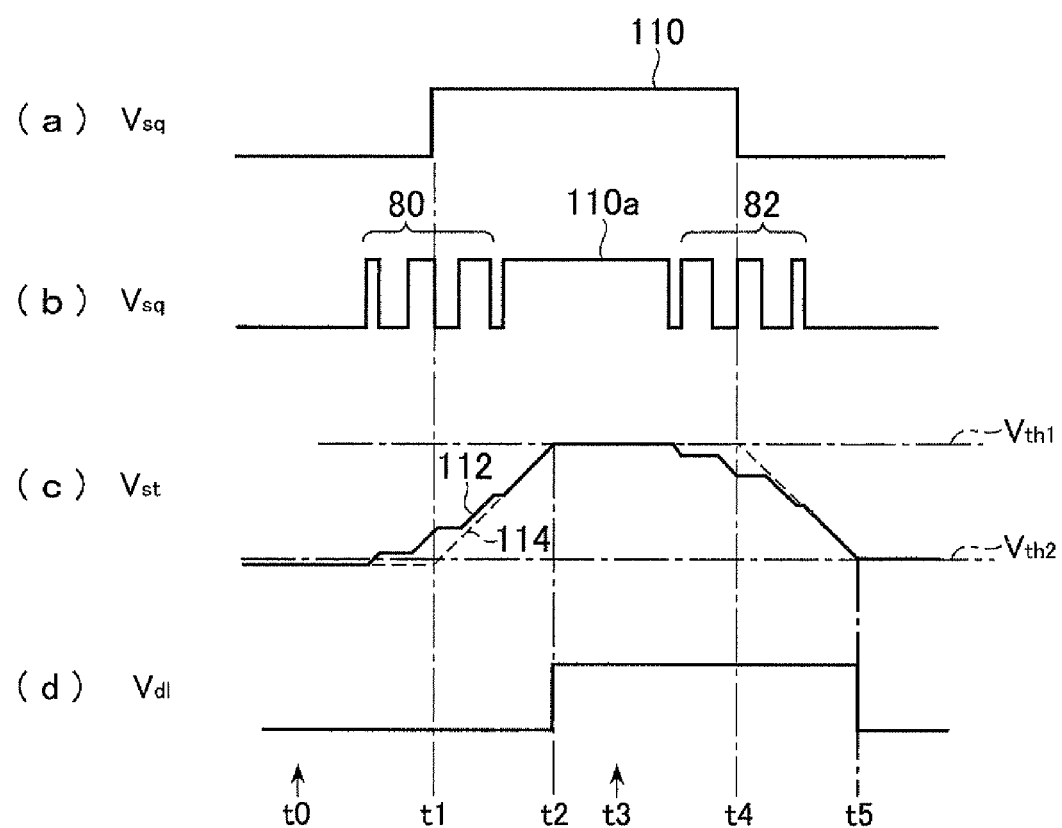
FIG. 5 is a schematic signal waveform diagram describing the operation of the delay circuit in FIG. 4.

FIG. 5 is a schematic signal waveform diagram describing the operation of the delay circuit 100. Waveform (a) in FIG. 5 is a waveform of the input signal Vsq (Vdi), and shows a case in which a pulse 110 is an ideal waveform unaccompanied by noise pulses 80, 82. In reality for this waveform, the noise pulses 80, 82 can accompany the input signal Vsq in the portions (rising edge, trailing edge) in which the signal levels thereof are switched. Waveform (b) in FIG. 5 shows a schematic waveform of a pulse 110a of the input signal Vsq accompanied by the noise pulses 80, 82.

Waveform (c) in FIG. 5 shows a signal waveform of the voltage Vst of the capacitor Cst. Variations of Vst in relation to the input signal having waveform (b) in FIG. 5 are shown by the solid line 112, and variations of Vst in relation to the input signal having waveform (a) in FIG. 5 are shown by the dashed line 114. Waveform (d) in FIG. 5 shows the waveform of the output signal Vd1 (Vdo) of the Schmitt comparator 102.

The operation of the delay circuit 100 over time will now be described in sequence in a process in which the ideal input signal Vsq shown by waveform (a) in FIG. 5 changes to the H level from the L level, and then to the L level from the H level.

In a state in which Vsq and Vd1 are at the L level (at time t0, for example), the switch SW3 selects the electric current source I1, and the switch SW1 is in the off-state. In this state, the charging current and the discharging current do not flow through the capacitor Cst, and Vst is substantially invariable.

The switch SW1 is then kept in the on-state relative to the ideal pulse 110 when the timing t1 of the rising edge of the input signal Vsq shown by waveform (a) in FIG. 5 has elapsed. The capacitor Cst is then charged, Vst rises, and when Vst exceeds the upper threshold Vth1 (at time t2), the Schmitt comparator 102 switches states, and the output signal Vd1 assumes the H level. On the other hand, the input signal Vsq having noise pulses generates noise pulses 80 in the period before and after time t1. The switch SW1 is in the on-state in the H-level period, which is part of the period in which the noise pulses 80 are created, the charging current flows through the capacitor Cst, and Vst rises, but the capacitor Cst is not charged or discharged and Vst stops rising in the L-level period, which is part of the period in which the noise pulses 80 are created. As a result, Vst starts rising prior to time t1 from the beginning of the noise pulses 80, but the rise is relatively slow. For example, in the pulse signal Vsq generated from the FM signal Vin by the waveform conversion circuit 52, the duty ratio during the generation period of the noise pulses 80 is about 50%, and the time when Vst reaches the upper threshold Vth1 is substantially the same as in the case of the ideal Vsq. Specifically, the difference between the time when the signal of the solid line 112 reaches the upper threshold Vth1 and the time when the signal of the dashed lined 114 reaches the upper threshold Vth1 is reduced compared with the generation period of the noise pulses 80, and the fluctuation of the rising edge timing of the output signal Vd1 brought about by the noise pulses 80 is inhibited.

The switch SW3 selects the electric current source I2 when Vst exceeds Vth1 and Vd1 is switched to the H level. In a state in which Vsq and Vd1 are at the H level (at time t3, for example), the switch SW3 selects the electric current source 12, and the switch SW2 is in the off-state. In this state, the charging current and the discharging current do not flow through the capacitor Cst, and Vst is substantially invariable.

The switch SW2 is subsequently kept in the on-state relative to the ideal pulse 110 when the timing t4 of the trailing edge of the input signal Vsq shown by waveform (a) in FIG. 5 has elapsed. The capacitor Cst is then discharged, Vst decreases relatively quickly, and when Vst exceeds the lower threshold Vth2 (at time t5), the Schmitt comparator 102 switches states, and the output signal Vd1 assumes the L level. On the other hand, the input signal Vsq having noise pulses generates noise pulses 82 in the period before and after time t4. The switch SW2 is in the on-state in the L-level period, which is part of the period in which the noise pulses 82 are created, the discharging current flows through the capacitor Cst, and Vst decreases, but the capacitor Cst is not charged or discharged and Vst stops decreasing in the H-level period, which is part of the period in which the noise pulses 82 are created. As a result, Vst starts decreasing prior to time t4 from the beginning of the noise pulses 82, but the decrease is relatively slow. For example, in the pulse signal Vsq generated from the FM signal Vin by the waveform conversion circuit 52, the duty ratio during the generation period of the noise pulses 82 is about 50%, and the time when Vst reaches the lower threshold Vth2 is substantially the same as in the case of the ideal Vsq. Specifically, the difference between the time when the signal of the solid line 112 reaches the lower threshold Vth2 and the time when the signal of the dashed lined 114 reaches the lower threshold Vth2 is reduced compared with the generation period of the noise pulses 82, and the fluctuation of the trailing edge timing of the output signal Vd1 brought about by the noise pulses 82 is inhibited.

By the operation of the delay circuit 100 described above, noise pulses that correspond to the noise pulses 80, 82 are removed (refer to waveform (b) in FIG. 3) from the portions (rising edge, trailing edge) of the delay signal Vd1 where signal levels are switched. In addition, fluctuations of the switch timing of the output signal Vd1 brought about by the noise pulses 80, 82 are inhibited.

The electric current sources 11, 12 are variable electric current sources, and can control the delay time in the delay circuit 100 by varying the supplied amount of electric current according to the delay control signal Vcnt. The delay time is feedback controlled so as to keep the phase difference of the delay signal Vd1 in relation to the pulse signal Vsq at 90° by using the delay control signal Vcnt generated on the basis of the phase detection result in the phase detector 56.

Figure 11:
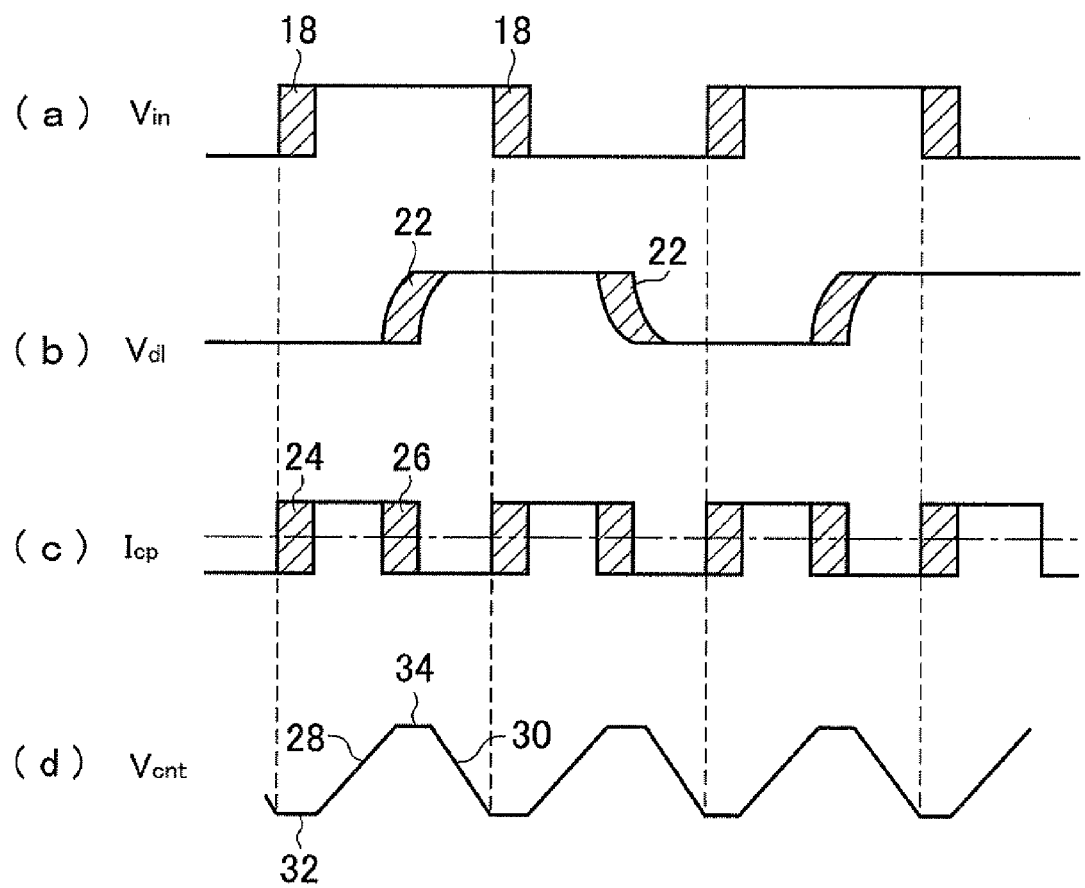
FIG. 11 is a schematic diagram of a signal waveform describing the problems in a DLL using a conventional voltage controlled delay line.

Short-period inversions of the electric current Icp (noise pulses 26 in waveform (b) of FIG. 11) are produced to a lesser extent at the time the electric current Icp synchronized with the switching (at times t2, t5) of the delay signal Vd1 inverts from the positive electric current Icp to a negative current. This is because noise pulses that correspond to the noise pulses 80, 82 from the delay signal Vd1 are removed. As a result, in the period when the delay control signal Vcnt moves from the rise (waveform 90 in waveform (d) of FIG. 3) to the fall (waveform 92 in waveform (d) of FIG. 3), a flat period (waveform 34 in waveform (d) of FIG. 11) becomes difficult to generate, the occurrence of dead zones in the loop control of DLL 54 is inhibited, and the S/N ratio of the demodulated signal Vdemo of the FM demodulator 50 can be improved.

In the structure of the aforementioned DLL 54, the noise pulses 84 that correspond to the noise pulses 80, 82 during the switching of the signal level of the pulse signal Vsq remain in the electric current Icp (refer to waveform (c) in FIG. 3). The noise pulses 84 can be removed if a delay circuit that is similar to the delay circuit 100 provided to the delay part 60 and has a fixed delay amount is provided subsequent to the waveform conversion circuit 52 or the phase detector 56. The occurrence of flat periods in the period when the delay control signal Vcnt moves from the fall to the rise is thereby inhibited, and further improvement is achieved in terms of reducing the dead zones in the control loop of the DLL 54 and raising the S/N ratio of the demodulated signal Vdemo of the FM demodulator 50.

The delay part 60 may be a structure obtained by connecting in series the delay circuit 100 and another delay circuit, such as the conventional voltage controlled delay line 6, for example. In this case, the amount of delay is fixed in the delay circuit 100, and the other delay circuit can be constituted of a circuit capable of controlling the amount of delay using the delay control signal Vcnt.

Figure 6:
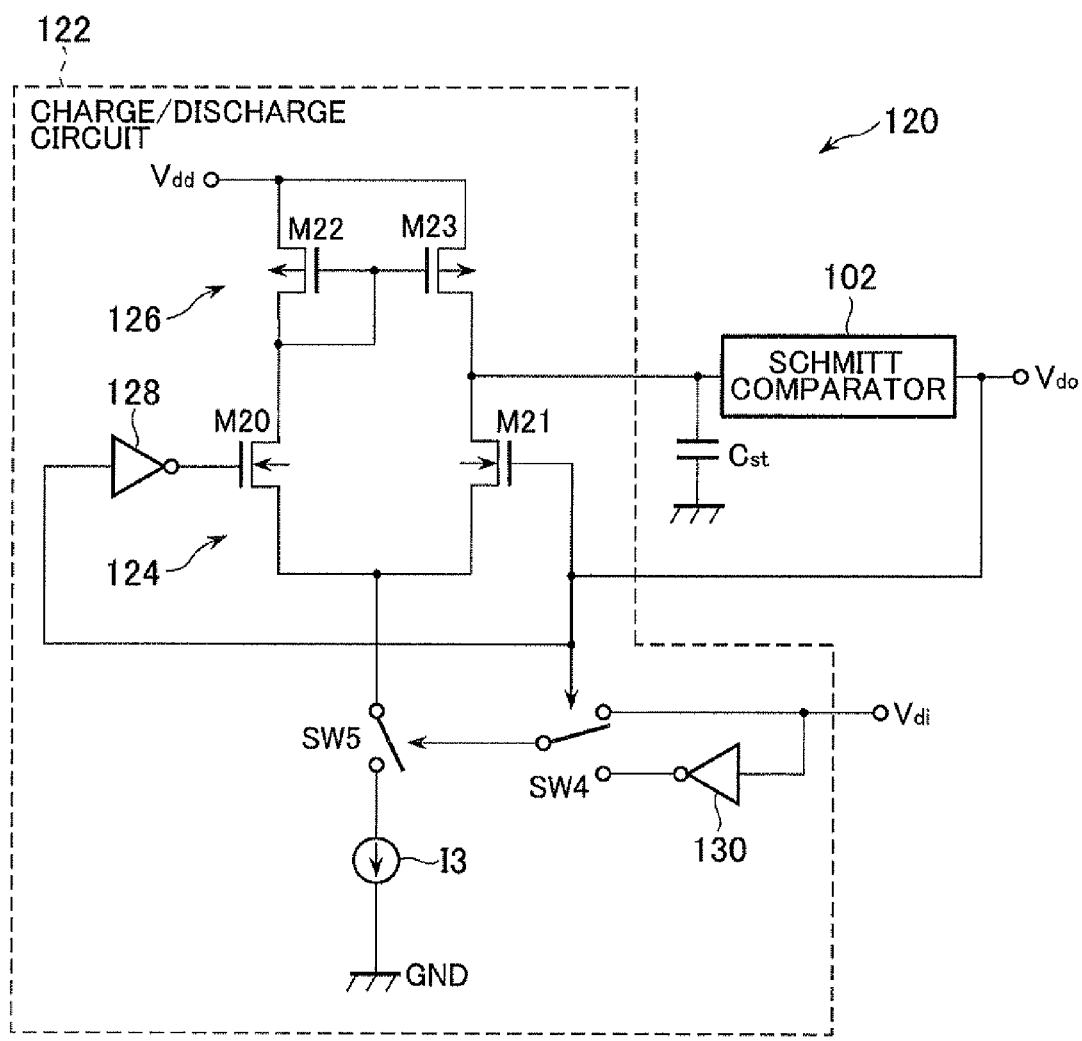
FIG. 6 is a general circuit diagram showing another structure of a delay circuit according to the present invention.
Figure 7:
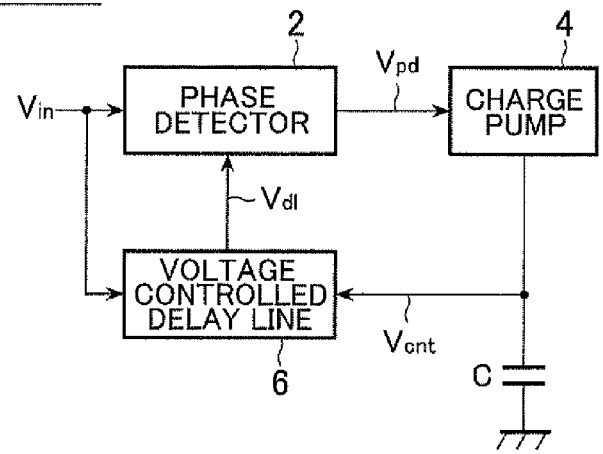
FIG. 7 is a block diagram showing the structure of a conventional DLL.
Figure 8:
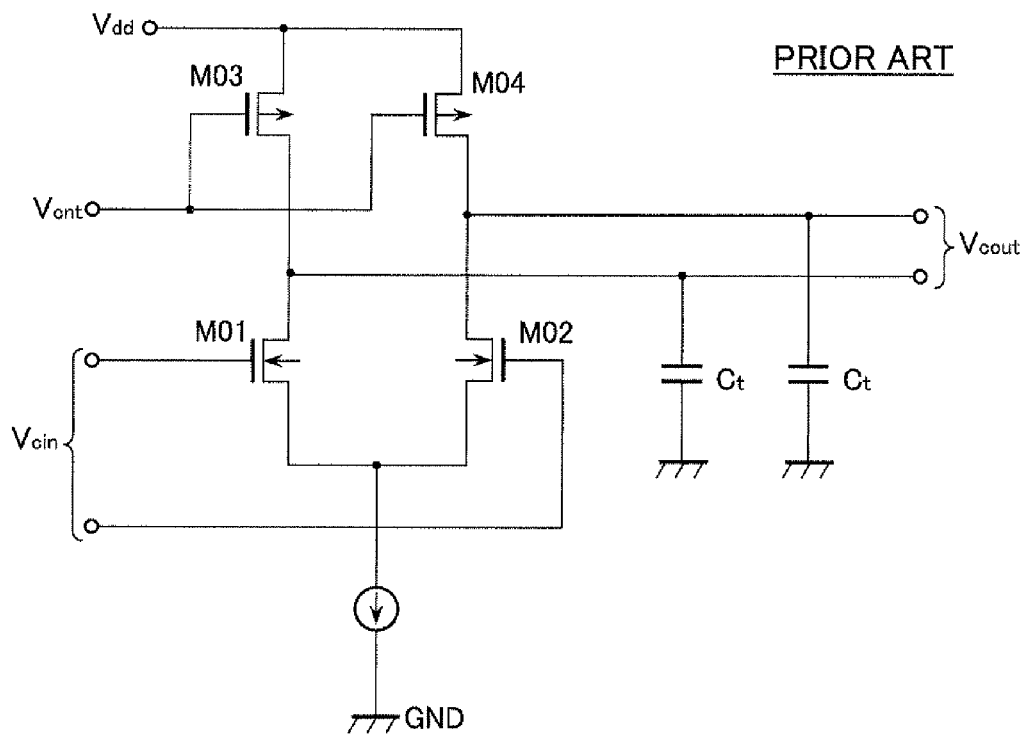
FIG. 8 is a circuit diagram of delay cells that constitute a conventional voltage controlled delay line.
Figure 9:
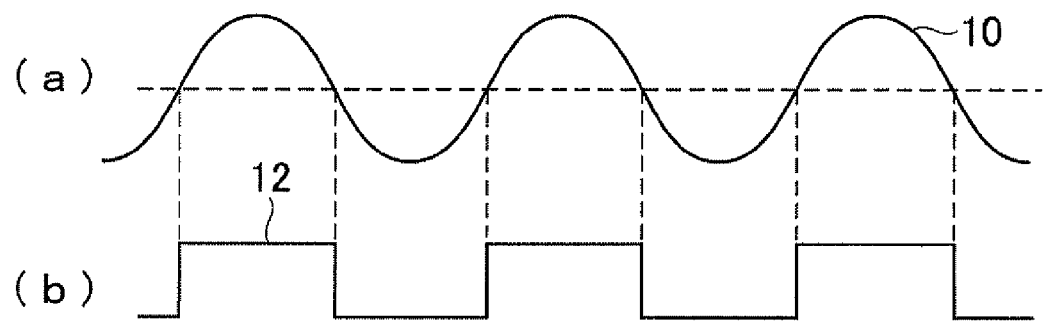
FIG. 9 is a schematic diagram showing a noise-free FM signal and a waveform in which the signal is binarized.
Figure 10:
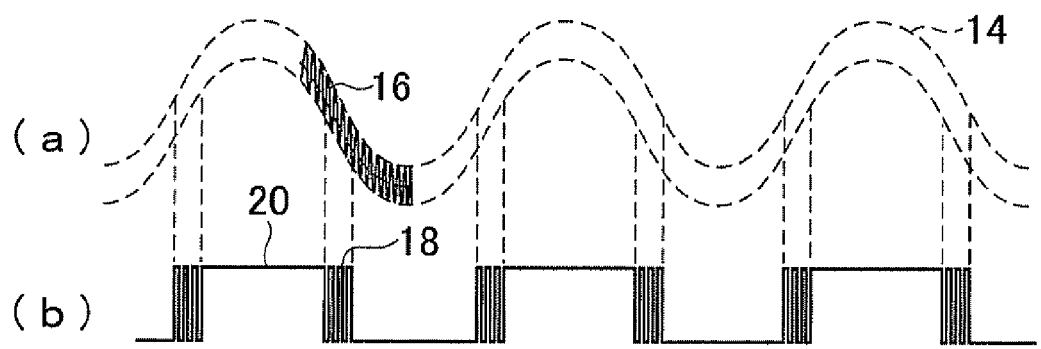
FIG. 10 is a schematic diagram showing a noise-superposed FM signal and a waveform in which the signal is binarized.

FIG. 6 is a general circuit diagram showing another structure of a delay circuit according to the present invention. The delay circuit 120 in FIG. 6 differs from the delay circuit 100 in FIG. 4 in having a charge/discharge circuit 122 instead of the charge/discharge circuit 104. The charge/discharge circuit 122 is constructed using a differential pair 124 composed of n-channel MOS transistors M20, M21; a current mirror circuit 126 composed of transistors M22, M23; an electric current source I3; switches SW4, SW5; and inverters 128, 130. The respective sources of the transistors M20, M21 are connected to the electric current source I3 via the switch SW5. The electric current of the transistor M20 is reversed in the current mirror circuit 126 and used to charge the capacitor Cst. On the other hand, the current of the transistor M21 is used to discharge the capacitor Cst.

The supply of electric current to the differential pair 124 from the electric current source I3 is turned on/off by the switch SW5 controlled by the input signal Vdi.

For example, the switch SW5 is composed of an n-channel MOS transistor. The input signal Vdi is impressed on the gate of the switch at unchanged polarity when the output signal Vdo is at the L level. On the other hand, the input signal Vdi inverted by the inverter 130 is impressed on the switch SW5 when the output signal Vdo is at the H level. The switch SW4 controlled by the output signal Vdo switches to impressing the input signal Vdi on the switch SW5 with or without inversion.

According to the present invention described above with reference to the embodiments, it is possible to provide a delay circuit in which fluctuation of the amount of delay brought about by noise pulses can be reduced.

What is claimed is:

1. A delay circuit for delaying and switching the level of an output signal relative to the switching between two levels in a single input signal, wherein:
   in a period in which the output signal is at a first output level correlated with a first input level of the input signal, a predetermined quantity to be evaluated is increased according to an integrated value of a period in which the input signal is at a second input level, and the output signal is switched from the first output level to the second output level when the quantity to be evaluated exceeds a predetermined upper threshold; and
   in a period in which the output signal is at a second output level correlated with the second input level, the quantity to be evaluated is reduced according to the integrated value of a period in which the input signal is at a first input level, and the output signal is switched from the second output level to the first output level when the quantity to be evaluated declines below a lower threshold set lower than the upper threshold.

2. The delay circuit of claim 1, comprising:
   a Schmitt trigger comparator for setting the upper threshold and the lower threshold for an input voltage, and outputting the output signal;
   a capacitor for inputting a voltage that corresponds to an amount of charge to the Schmitt trigger comparator; and
   a charge/discharge circuit for alternatively outputting a charging current to charge the capacitor and a discharging current to discharge the capacitor; wherein the charge/discharge circuit selectively outputs the charging current in a period in which the output signal is at the first output level and the input signal is at the second input level; and
   wherein the charge/discharge circuit selectively outputs the discharging current in a period in which the output signal is at the second output level and the input signal is at the first input level.

3. The delay circuit of claim 2, the charge/discharge circuit having:
   a charging current source for generating the charging current; a discharging current source for generating the discharging current;
   a charge/discharge selection switch provided between the capacitor and the charging current source and discharging current source, and used to connect the charging current source and the capacitor in a period in which the output signal is at the first output level, and to connect the discharging current source and the capacitor in a period in which the output signal is at the second output level;
   a charge control switch connected in series between the charging current source and the charge/discharge selection switch, and used to selectively establish an on-state in a period in which the input signal is at the second input level; and
   a discharge control switch connected in series between the discharging current source and the charge/discharge switch, and used to selectively establish the on-state in a period in which the input signal is at the first input level.

* * * * *